United States Patent

Choi

Patent Number: 5,929,793
Date of Patent: Jul. 27, 1999

[54] HIGH SPEED VARIABLE LENGTH CODE DETECTION USING A CASCADED STRUCTURE

[75] Inventor: Byeong Ho Choi, Seoul, Rep. of Korea

[73] Assignee: LG Electronics Inc., Seoul, Rep. of Korea

[21] Appl. No.: 08/815,943

[22] Filed: Mar. 13, 1997

[30] Foreign Application Priority Data

Mar. 15, 1996 [KR] Rep. of Korea .................. 96 7003

[51] Int. Cl.$^6$ ............................................. H03M 7/40
[52] U.S. Cl. ............................................................ 341/67
[58] Field of Search .................................. 341/63, 65, 67

[56] References Cited

U.S. PATENT DOCUMENTS

| | | | |
|---|---|---|---|
| 5,138,316 | 8/1992 | Konishi | 341/67 |
| 5,226,082 | 7/1993 | Kustka | 341/67 |
| 5,394,144 | 2/1995 | Kim | 341/67 |
| 5,467,088 | 11/1995 | Kinouchi et al. | 341/65 |
| 5,617,089 | 4/1997 | Kinouchi et al. | 341/65 |
| 5,784,012 | 7/1993 | Kawauchi et al. | 341/67 |

Primary Examiner—Howard L. Williams

[57] ABSTRACT

A high speed code word detecting apparatus and method using a cascade structure detects and separates a variable length code from packed data at high speed in accordance with a code word characteristic. The apparatus includes a code length determining unit for determining a plurality of code length values in accordance with a code starting point determination mask for a number corresponding to a maximum code length value when a packet stream is applied, and a code word selecting unit for generating respective code word starting points based upon remaining bits of a code word separated during a just previous clock cycle, and separating a plurality of code words from the plurality of determined code length values during one clock cycle using a cascade structure. The method includes a first step for sequentially determining a plurality of code length values in accordance with a code starting point determination mask for a number corresponding to a maximum code length value when a packet stream is applied, and a second step for generating respective code word starting points based upon remaining bits of a code word separated during a just previous clock cycle, and separating a plurality of code words from the plurality of determined code length values during one clock cycle.

10 Claims, 6 Drawing Sheets

FIG.3A
CONVENTIONAL ART
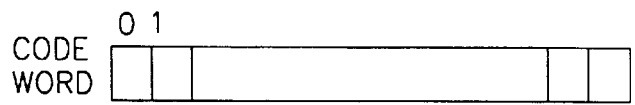
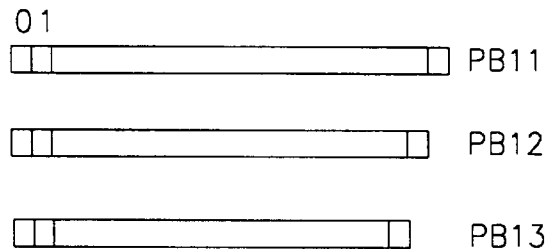
FIG.3B
CONVENTIONAL ART
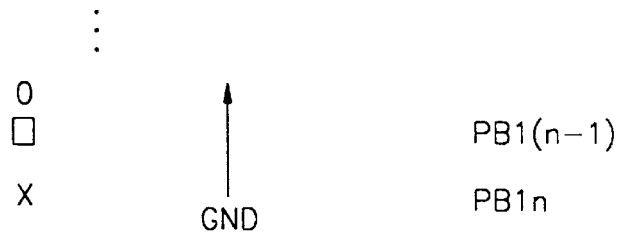
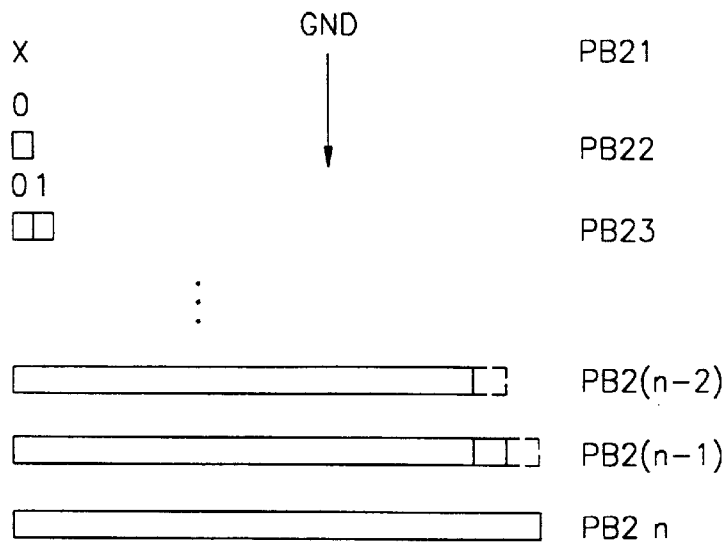
FIG.3C
CONVENTIONAL ART

HIGH SPEED VARIABLE LENGTH CODE
DETECTION USING A CASCADED
STRUCTURE

BACKGROUND OF THE INVENTION

1. Field of the Invention

The present invention relates to an image compression system, and more particularly to a high speed code word detecting apparatus and method using a cascade structure which makes it possible to detect a code word having a variable length according to a successive bit stream encoded using a run-length encoding method.

2. Description of the Prior Art

In general, because it includes a large amount of information, motion picture image data requires a significantly large memory space, bandwidth, and high speed throughput for carrying out the steps of storing, transmitting or processing. Thus, an appropriate, affordable and distortion free image compression technology is virtually required for storage and transmission transmission.

Such a data compression technology is focused on restoration of data. For that reason there is employed a variable length encoding method which is frequently applied for a lossless compression. In a variable length encoding method, a fixed length data is converted into a variable length code depending on a statistical characteristic of the data.

Variable length encoding a short code word for frequently generated data and a long code word is allocated for data occuring less frequency.

Therefore, when a variable length code word is allotted in a library of every possible source code word, the length of an average code word of a variable length code becomes much shorter than that of an average code word length of the source data, whereby data compression is achieved. At this time, according to a statistical characteristic of the data, there is employed a Huffman coding method for a variable length code.

As shown in FIG. 1, a conventional bit packing apparatus includes: an adder 10 for adding an applied code length value to a modulo value obtained by subtracting a packing bit length from a previous code length value; a comparator 11 for comparing an output value of the adder 11 and the size value of the packing bit PB and outputting a control signal; a modulo operator 12 for dividing an output value of the adder by packing bit PB and determining the remainder value; a first multiplexer 13 for outputting a packing bit PB which is a remainder value and is outputted from the modulo operator 12 and which is selected from a plurality n of packing bits PB11–PB1$n$ which sequentially decrease by a certain amount of bits; a second multiplexer 14 for outputting a packing bit PB which is a remainder value and is outputted from the modulo operator 12 and which is selected from a plurality n of packing bits PB21–PB2$n$ which are sequentially increased by a certain amount of bits; an OR gate 15 for ORing a packing bit PB outputted from the first multiplexer 13 and a remainder bit RB; a third multiplexer 16 for converting to a new remainder bit RB a packing bit PB outputted from the OR gate 15 or a packing bit PB outputted from the second multiplexer 14, in accordance with the control signal of the comparator 11; and a flipflop 17 for latching and outputting a full packing bit PB outputted from the OR gate 15, in accordance with a control signal of the comparator 11. The detailed composition of the first and second multiplexers 13, 14 is illustrated in FIG. 2.

The operation of the thusly constituted conventional bit packing apparatus will now be described with reference to the accompanying drawings.

First, when a codeword and a code length are simultaneously applied, if the codeword is "11011", the code length is "5", and the data for packing is 8 bits, the data arrayed in order from the most significant bit becomes "1101 1000".

At this time, the adder 10 adds the remainder value obtained by subtracting a packing bit from a previous code length, to a serially applied code length. The modulo operator 12 determines a remainder value by dividing the output value of the adder 10 by the packing bit PB to thereby decide the size of a codeword which is to be applied to a next packing bit.

The number of bits in the output from the modulo operator 12, counted from the significant bit, is defined by the the remainder value, so that there is required a next packing data obtained by subtracting the remainder bits from the packing bits.

Therefore, the first multiplexer 13 outputs a packing bit PB serving as a remainder value outputted from the modulo operator 12 from among the packing bits PB11–PB1$n$ having pointer values decreased sequentially by a certain amount of bits, whereas the second multiplexer 14 outputs a packing bit PB serving as a remainder value outputted from the modulo operator 12 from among the packing bits PB21–PB2$n$ having pointer values increased sequentially by a certain amount of bits.

When a code word as shown in FIG. 3A is applied, the first multiplexer 13 selects a corresponding bit among packing bits PB1$n$–PB1$n$, as shown in FIG. 3B, and outputs the selected bit to the OR gate 15; the second multiplexer 14 selects a corresponding bit among packing bits PB2$n$–PB2$n$, as shown in FIG. 3C, and outputs the selected bit to the third multiplexer 16.

At this time, the comparator 11 compares an output value of the adder 10 and the packing bit PB, so that when the output of the adder 10 is equal to or larger than that of the packing bit PB, a control signal of "1" is outputted, and when the output of the adder 10 is less than that of the packing bit PB, a control signal of "0" is outputted.

In accordance with this control signal outputted from the comparator 11, the third multiplexer 16 selects an output value of the OR gate 15 or an output value of the second multiplexer 14 to thereby output a remainder bit RB, and the OR gate 15 ORs the output value of the first multiplexer 13 and the output value of the third multiplexer 16 so that the present packing bit and remainder bit RB are ORed to thereby output a certain size of packing bits.

For example, assuming that the number of packed bits are eight, remainder bits RB are "1100 0000", and present packing bits are "0000 1010", the OR gate 15 serves to output packed bits "1100 1010" by an OR operation.

Using the same steps as described above, the third multiplexer 16, according to the control signal of the comparator 11, selects an output value of the OR gate 15 or an output value of the second multiplexer 14 to repeatedly generate a remainder bit RB, and the newly generated remainder bits RB are ORed with an output value of the first multiplexer 13 at the OR gate 15 to thereby output a certain amount of packed bits.

At this time, a variable length coding has an irregular code length. Therefore, in order to store and transmit a serial bit stream, the data should be held in a buffer until the data buffer becomes full or overflows.

As a result, the flipflop 17 holds the data until the comparison signal outputted from the comparator 11 becomes "1", that is to say, when the packing bits outputted from the OR gate 15 become full, the held packing bits are outputted.

As described above, the conventional bit packing apparatus randomly selects the number of bits which are to be packed, and in a formatter of a high picture quality VCR, the selectedly fixed bits can be recorded in a memory device having an 8-bit or 16-bit word length as well as accessed therefrom. Also, the length of a code word can be easily varied using a much smaller number of packing bits.

However, the conventional bit packing apparatus does not determine a code word per input unit applied thereto once a cycling time, so that a maximum code length should be allocated thereto, and thus the apparatus is not suitable.

SUMMARY OF THE INVENTION

Accordingly, it is an object of the present invention to provide a high speed code word detecting apparatus and method using a cascade structure which makes it possible to detect and separate a variable length code from packed data at a high speed in accordance with a code word characteristic.

It is another object of the present invention to provide a high speed code word detecting apparatus and method using a cascade structure capable of separating a code word for variable length decoding as well as unpacking packed data at a certain speed.

To achieve the above-described objects, there is provided a high speed code word detecting apparatus using a cascade structure according to the present invention which includes a code length determining unit for determining a plurality of code length values when a packet stream is applied in accordance with a code starting point determination mask for a number corresponding to a maximum code length value, and a code word selecting unit for generating respective code word starting points based upon remaining bits of a code word separated during a just previous clock cycle, and separating a plurality of code words from the plurality of determined code length values during one clock cycle using a cascade structure.

Further, a high speed code word detecting method using a cascade structure according to the present invention includes a first step for sequentially determining a plurality of code length values when a packet stream is applied in accordance with a code starting point determination mask for a number corresponding to a maximum code length value, and a second step for generating respective code word starting points based upon remaining bits of a code word separated during a just previous clock cycle, and separating a plurality of code words from the plurality of determined code length values during one clock cycle.

BRIEF DESCRIPTION OF THE DRAWINGS

FIGS. 3A through 3C are exemplary views of code lengths with regard to the apparatus of FIGS. 1 and 2;

DETAILED DESCRIPTION OF THE INVENTION

Figure 1:
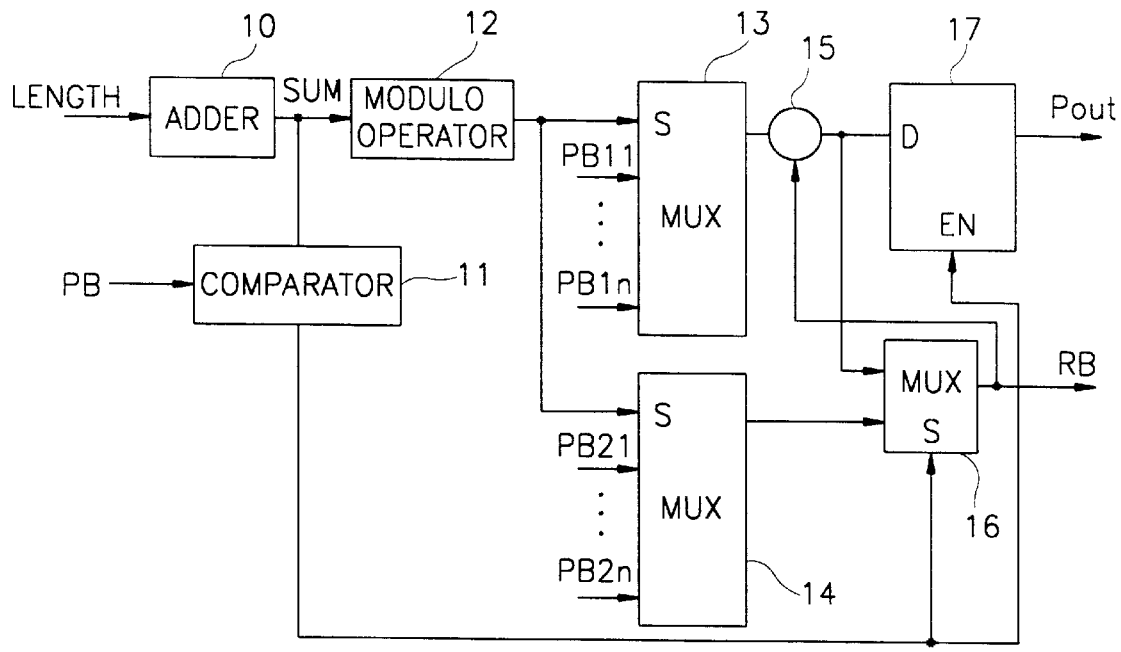
FIG. 1 is a schematic block diagram of a conventional bit packing apparatus.
Figure 2:
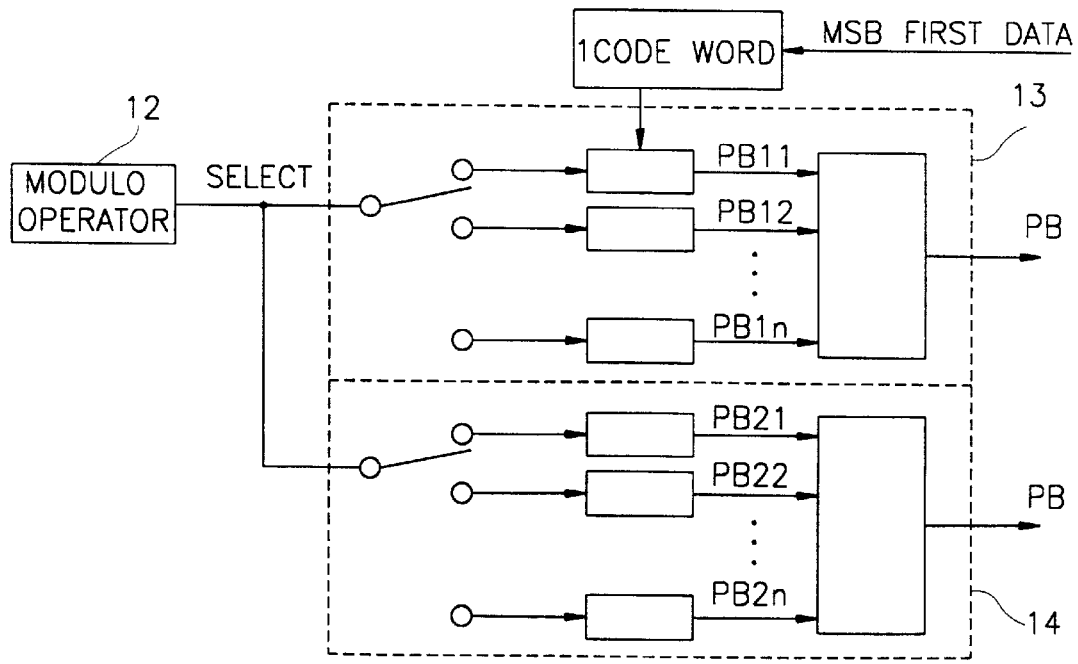
FIG. 2 is a detailed block diagram showing multiplexers in the circuit of FIG. 1.
Figure 4:
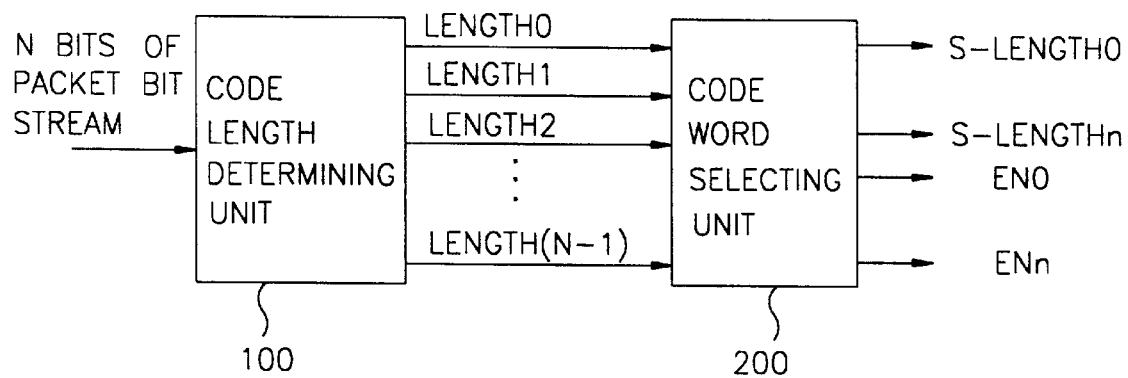
FIG. 4 is a detailed block diagram of a high speed code word detecting apparatus using a cascade structure according to an embodiment of the present invention.

As shown in FIG. 4, a high speed code word detecting apparatus using a cascade structure according to the present invention includes a code length determining unit 100 for determining a code length in accordance with an N-bit packet stream (packed data), and a code word selecting unit 200 for determining a starting point in accordance with code length values length0–length(N–1) determined in the code length determining unit 100 for thereby separating a plurality of code words from the packet stream.

Figure 5:
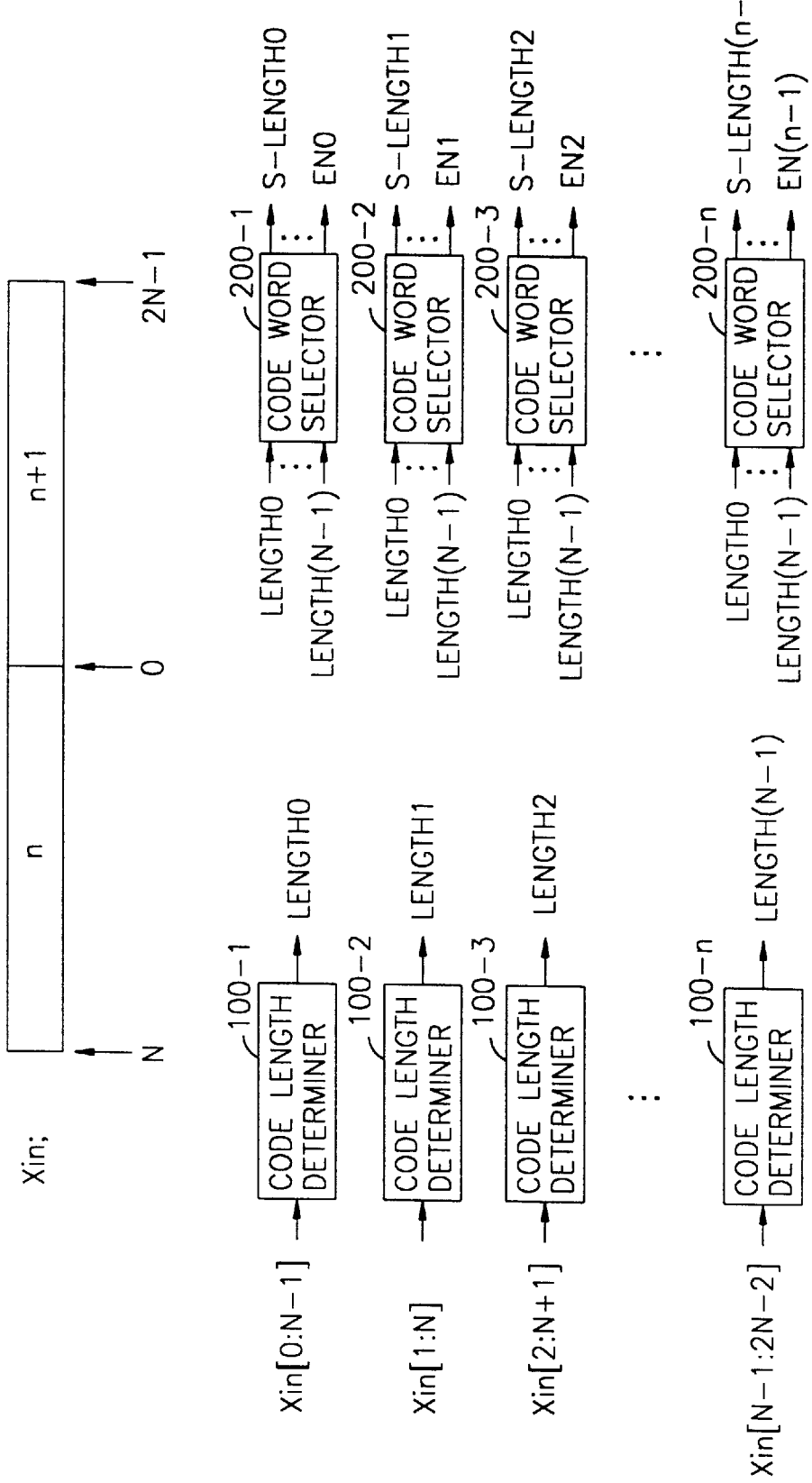
FIG. 5 is a detailed block diagram of the apparatus of FIG. 4.

As shown if FIG. 5, code length determining unit 100, is provided with a plurality N of code length determiners 100-1 . . . 100-n connected in parallel with one another, and the code word selecting unit 200 is provided with a plurality N of code length selectors 200-1 . . . 200-n connected in parallel with one another and in series with the code length determining unit.

Figure 6:
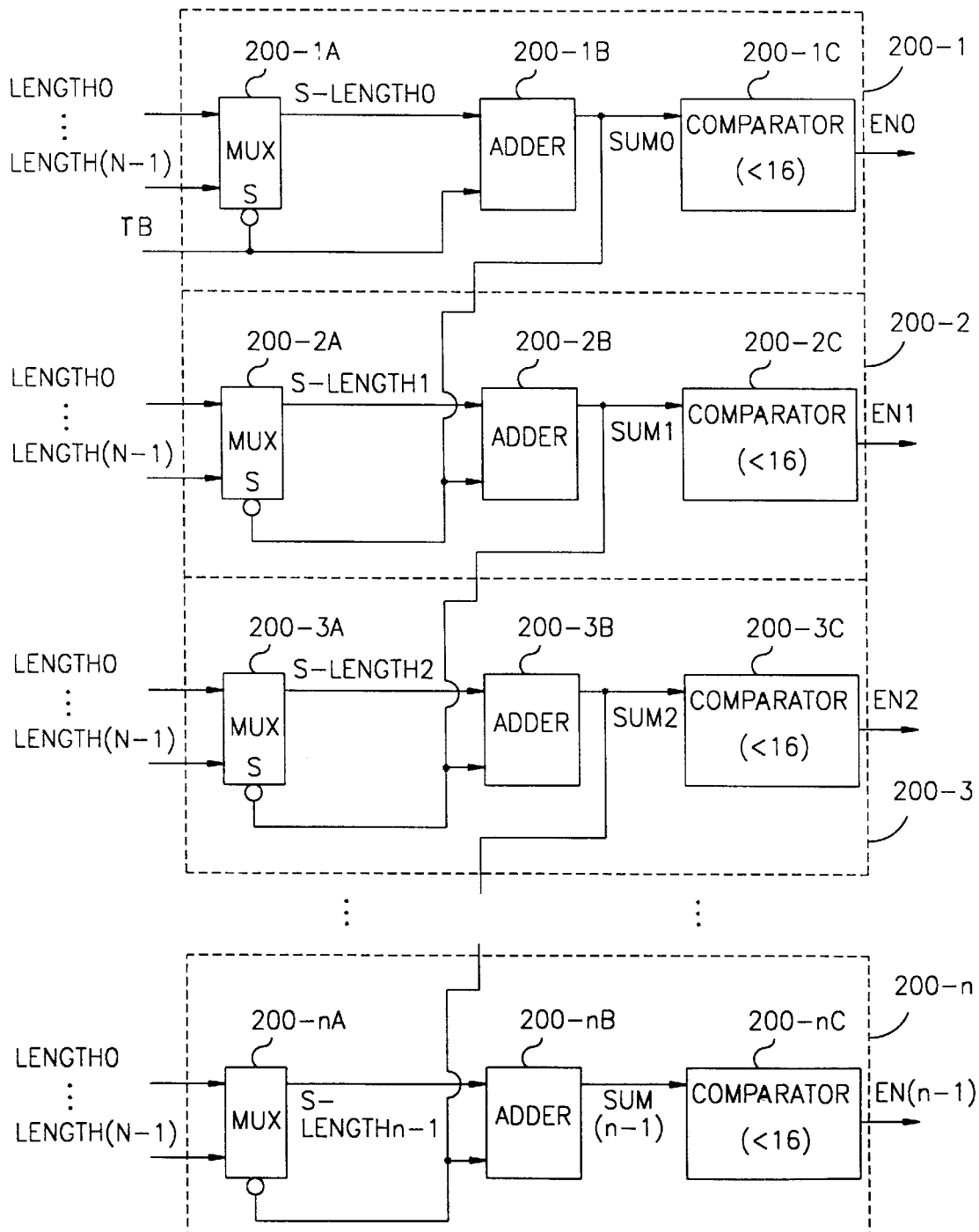
FIG. 6 is a detailed block diagram of a code word selecting unit in FIG. 5.

The plurality N of code word selectors 200-1 . . . 200-n, as shown in FIG. 6, have a cascade structure, and each of the selectors 200-1 . . . 200-n is composed of a multiplexer, an adder and a comparator.

The multiplexer selects and outputs one of the code length values length0–length(N–1) outputted from the code length determining unit 100 in accordance with a selection signal. The adder adds the code length value selected from the multiplexer and a selection signal. The comparator compares an output value of the adder with a maximum length of the applied code words to thereby judge whether the code length selected in the multiplexer remains valid. Here, an output value of the adder is applied as a selection bit to the next multiplexer and to a terminal of a next adder, respectively.

The operation of the thusly constituted high speed code word detecting apparatus using a cascade structure will now be described.

The code word detecting apparatus of the present invention sequentially detects a plurality of code words from an N-bit packet stream for one-clock cycle.

Specifically, when an N-bit packet stream is applied, the code length determining unit 100 determines code length values length0–length(N–1) using a determining mask at each of a plurality N of code starting points so as to correspond to a maximum code length N. That is, the plurality N of code length determiners 100-1 . . . 100-n transfer starting points from 0 to N–1 in order to consider all the possible cases, while forming a detecting window.

At this time, the output values length0–length(N–1) of the code length determiners 100-1 . . . 100-n serve to detect code words against all the possible cases with regard to the plurality N of starting points.

The code word selecting unit 200 serves to separate a corresponding code word from code length values length0–length(N–1) outputted from the code length determiners 100-1 . . . 100-n through the plurality N of code word selectors 200-1 . . . 200-n.

At this time, separation of the corresponding code word begins at the end of the remaining code word which was separated during the just previous clock cycle. On the basis of this starting point, the next code word is selected and the selected code word is separated from an input bit stream Xin. That is, when a code word separated during the just previous clock cycle occupies the first three bits of the bit stream Xin, the code length becomes length(3-1).

The detailed operation of the code word selecting unit 200 will be described.

As shown in FIG. 6, when code length values length0–length(N-1) outputted from the code length determining unit 100 are applied to multiplexers 200-1A, 200-2A ... 200-nA provided in a corresponding one of the plurality N of code word selectors 200-1 ... 200-n, the multiplexer 200-1A receives as a starting point a transmit bit TB which belongs to the last series of code words during the just previous clock cycle, and selects a code length value S-length0. Here, the selected code length value S-length0 is added to the transmit bit TB at the adder 200-1B.

The comparator 200-1C compares an output value SUM0 of the adder 200-1B with a maximum length (such as 16 bits) of the code words, and if the output value SUM0 is less than the maximum length of the code word, an enable signal EN0 is outputted to validate the code length selected from the multiplexer 200-1A.

Meanwhile, the multiplexer 200-2A sets as a new starting point the output value SUM0, applied thereto as a selected bit SB, from the adder 200-1B, and outputs a corresponding code length S-length1. The adder 200-2B adds the selected code length value S-length1 and the output value SUM0 from the adder 200-1B, and the added value SUM1 becomes a new starting point of the multiplexer 200-3A. The comparator 200-2C compares the output value SUM1 from the adder 200-2B with the maximum length of the code words, and if the output value SUM1 is less than the maximum length of the code word, an enable signal EN1 is outputted to validate the code length selected from the multiplexer 200-2A.

Figure 7:
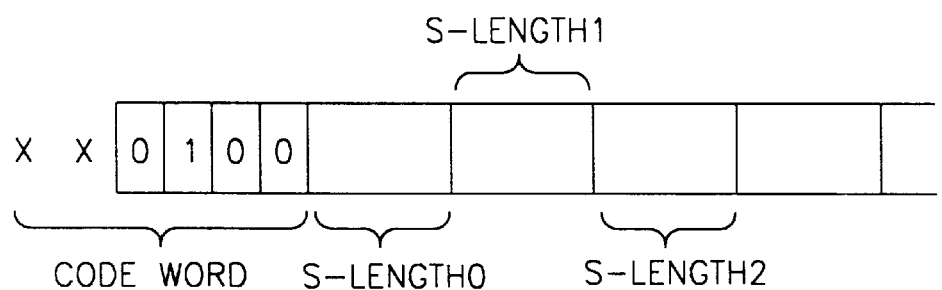
FIG. 7 is an exemplary view of a code length showing a detecting position of a starting point in the selecting unit of FIG. 6.

The multiplexers 200-3A ... 200-nA each repeat the above steps in cascade and output corresponding code length values S-length 2 ... S-length(n-1), and the comparators 200-3C ... 200-nC output enable signals EN2 ... EN(n-1) when the selected code length remains valid. At this time, the detected position of the starting point is as shown in FIG. 7.

Here, when an output value of the adders 200-1B ... 200-nB in the code word selectors 200-1 ... 200-n exceeds a maximum length (such as 16 bits) of the code words, the code word detecting operation with regard to the N-bit packet bit stream becomes terminated.

Also, the transmit bit TB is obtained by subtracting a maximum length (such as 16 bits) from an output value of the last code word selector 200-n, and it is applied to a next group t+1 or in a next clock cycle as the new starting point.

In the above-described operation, a plurality of code words are sequentially detected from the N-bit packet bit stream during one-clock cycle. That is, according to the above steps, per each clock cycle, a code word is determined and the length of the code word is calculated.

Figure 8:
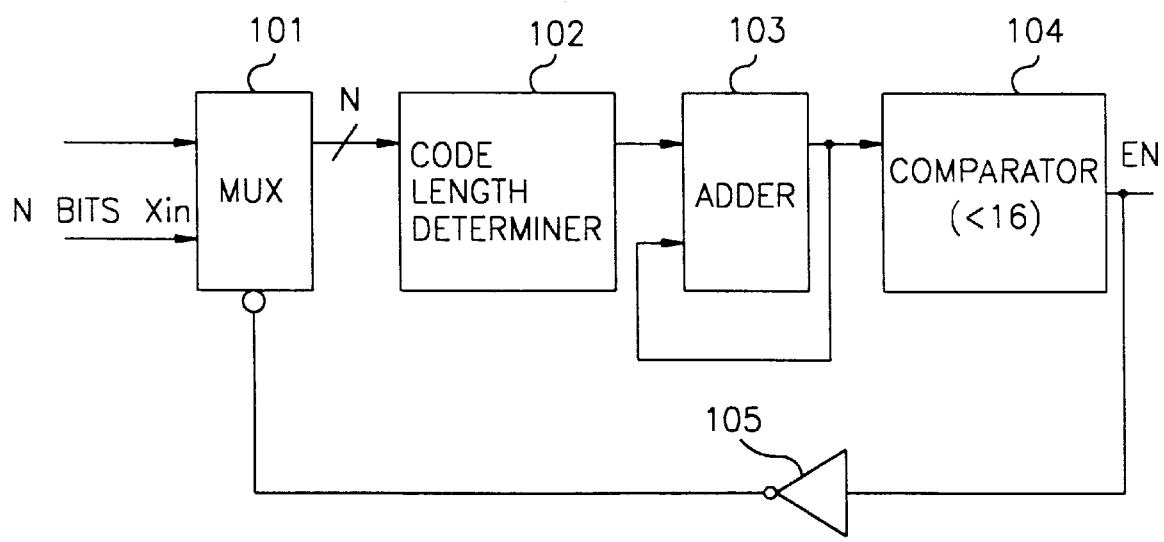
FIG. 8 is a schematic block diagram of a high speed code word detecting apparatus according to another embodiment of the present invention.

FIG. 8 shows another embodiment of the present invention which includes a multiplexer 101 for selecting one bit of an N-bit packet bit stream Xin in accordance with a selected bit, a code length determiner 102 for determining a code length from an output value of the multiplexer 101, an adder 103 for accumulating output values of the code length determiner 102, a comparator 104 for outputting an enable signal EN if an output value of the adder 103 is less than a maximum length of the code word, and an inverter 105 for inverting the enable signal EN and applying the inverted enable signal as the selected bit to the multiplexer 101.

First, when an N-bit packet bit stream is applied, the multiplexer 101 selects a single code length in accordance with a selected bit, and the selected code length is determined in accordance with the code length determiner 102. At this time, the output value of the code length determiner 102 becomes accumulated in the adder 103, and the comparator 104 serves to determine whether the output value of the adder 103 is larger than the maximum length (such as 16 bits) of the code word.

If the accumulated value in the adder 103 is less than the maximum value of the code word, the comparator 104 outputs the enable signal EN, which is in turn inverted in the inverter 105 and applied as the selected bit to the multiplexer 101, thereby selecting a code length so as to separate a next code word.

According to the embodiment of the present invention as shown in FIG. 8, when an N-bit packet stream is applied, one code length per one clock cycle is determined, and a starting point of the code word becomes increasingly shifted by accumulating the determined code length values in accordance with the adder 103 at each clock cycle.

Also, in order to separate the N-bit code word, an identical operation is repeatedly carried out as many int$\{(N/1_{min})+1\}$ times as the clock frequency, and it is an advantage that in spite of the elongated determination time, the necessary hardware can be much simplified. (here, $1_{min}$ denotes a minimum code length).

As described above, the present invention detects an N-bit code word during one clock cycle and is applicable to a high speed code word detection for a time share process in an image compression system and also a result can be obtained in a single trial, thereby facilitating a timing control of the hardware.

Further, the present invention determines a code word at a single time, thereby decreasing a buffer memory space and making it applicable to a low speed mode.

What is claimed is:

1. A high speed code word detecting apparatus using a cascade structure, comprising:

a code length determining unit for determining a plurality of code length values in an input packet stream in accordance with a code starting point determination mask for a number corresponding to a maximum code length value; and a code word selecting unit for generating respective code word starting points based upon remaining bits of a code word separated during a previous clock cycle, and separating in cascade each of a plurality of code words from the plurality of determined code length values during one clock cycle.

2. The apparatus of claim 1, wherein the code word determining unit includes a plurality of code length determiners corresponding in number to a maximum length of a code and connected in parallel with one another.

3. The apparatus of claim 1, wherein the code word selecting unit includes a plurality of code word selectors having a cascade structure and each respectively receiving one of a plurality of code length values outputted from the code length determining unit.

4. The apparatus of claim 3, wherein each of the plurality of code word selectors includes a multiplexer for selecting and outputting one of the code length values outputted from the code length determining unit in accordance with a selection signal, an adder for adding a code length value selected by the multiplexer and the selection signal, and a comparator for comparing an output value of the adder with a maximum length of the applied code words to thereby judge whether the code length selected by the multiplexer remains valid.

5. The apparatus of claim 4, wherein a multiplexer of a first of the plurality of code word selectors receives as the selection signal remaining bits of a code word separated during a just previous clock cycle, and outputs a corresponding code length value from the selection signal as a starting point.

6. The apparatus of claim 4, wherein multiplexers of the plurality of code word selectors succeeding the first code word selector each receive as their selected signal an output value of the adder of a previous code word selector during a just previous clock cycle, and output a corresponding code length value with the selection signal as a starting point.

7. The apparatus of claim 4, wherein a value obtained by subtracting a maximum code word value from an output value of the last code word selector is applied to a next stage.

8. A high speed code word detecting apparatus, comprising:

a multiplexer for multiplexing a packed bit stream in accordance with a selection bit;

a code length determiner for determining a code length from an output value of the multiplexer;

an adder for accumulating output values of the code length determiner and increasing a value of a starting point a comparator for denoting a validity of a code length selected from the multiplexer when an output value of the adder is less than a maximum length of the code word; and an inverter for inverting an output signal of the comparator and applying the inverted signal as the selection bit to the multiplexer.

9. A high speed code word detecting method using a cascade structure, comprising:

sequentially determining a plurality of code length values by applying a code starting point determination mask for a number corresponding to a maximum code length value to an input packet stream; and generating respective code word starting points based upon remaining bits of a code word separated during a previous clock cycle, and separating a plurality of code words from the plurality of determined code length values during one clock cycle.

10. The method of claim 9, wherein generating respective code word starting points and separating the plurality of code words comprises:

receiving the plurality of determined code length values and selecting a corresponding code length in accordance with a starting point generated on the basis of remaining bits of a code word separated during the previous clock cycle;

generating a new starting point by summing the generated starting point and the selected code length value; and comparing the summed value with a maximum length value of a code word and determining whether the selected code length value remains valid.

* * * * *